(12) United States Patent
Hosokawa

(10) Patent No.: US 8,823,256 B2
(45) Date of Patent: Sep. 2, 2014

(54) ORGANIC ELECTROLUMINESCENT ELEMENT AND ILLUMINATION DEVICE

(75) Inventor: Chishio Hosokawa, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

(21) Appl. No.: 13/981,603

(22) PCT Filed: Jan. 24, 2012

(86) PCT No.: PCT/JP2012/051439
§ 371 (c)(1),
(2), (4) Date: Jul. 24, 2013

(87) PCT Pub. No.: WO2012/102269
PCT Pub. Date: Aug. 2, 2012

(65) Prior Publication Data
US 2013/0307406 A1    Nov. 21, 2013

(30) Foreign Application Priority Data

Jan. 25, 2011  (JP) .................................. 2011-013060

(51) Int. Cl.
*H01L 51/50* (2006.01)
(52) U.S. Cl.
CPC ....................................... *H01L 51/50* (2013.01)
USPC ............................ 313/504; 313/506; 313/512
(58) Field of Classification Search
USPC ........................................ 313/506, 504, 512
See application file for complete search history.

(56) References Cited

U.S. PATENT DOCUMENTS

| | | | | |
|---|---|---|---|---|
| 6,111,357 A * | 8/2000 | Fleming et al. | ............... | 313/509 |
| 6,420,031 B1 * | 7/2002 | Parthasarathy et al. | .... | 428/411.1 |
| 7,166,959 B2 * | 1/2007 | Suzuki et al. | ................. | 313/504 |
| 2005/0007015 A1 * | 1/2005 | Yokoyama et al. | ........... | 313/506 |
| 2005/0140288 A1 * | 6/2005 | Suzuki | ........................ | 313/506 |
| 2005/0218794 A1 * | 10/2005 | Seo et al. | ...................... | 313/504 |
| 2007/0126358 A1 * | 6/2007 | Okutani et al. | ............... | 313/512 |

FOREIGN PATENT DOCUMENTS

| JP | 2003-229283 | 8/2003 |
|---|---|---|
| JP | 2005-078979 | 3/2005 |
| JP | 2006-100191 | 4/2006 |
| JP | 2008-235193 | 10/2008 |
| JP | 2008-243772 | 10/2008 |
| JP | 2010-245026 | 10/2010 |

OTHER PUBLICATIONS

English Translation JP2003229283, published Aug. 15, 2003.*
International Preliminary Report on Patentability with Translation of Written Opinion of the International Searching Authority for corresponding International Application No. PCT/JP2012/051439, Jul. 30, 2013.
International Search Report for corresponding International Application No. PCT/JP2012/051439, Apr. 24, 2012.

* cited by examiner

*Primary Examiner* — Mary Ellen Bowman
(74) *Attorney, Agent, or Firm* — Ditthavong & Steiner, P.C.

(57) ABSTRACT

An organic electroluminescence device includes: a first substrate; a reflective metal layer; a first electrode; an organic compound layer; and a second electrode, which are disposed in this sequence. The first substrate is provided by at least one of a metal film, a metal plate, a polymer film, a polymer plate, a polymer film with a damp-proof film, and a polymer plate with a damp-proof film. A smoothening layer is formed partially between the reflective metal layer and the first electrode. The reflective metal layer and the first electrode are electrically conductive to each other at a region where the smoothening layer is not formed.

8 Claims, 3 Drawing Sheets

ORGANIC ELECTROLUMINESCENT ELEMENT AND ILLUMINATION DEVICE

TECHNICAL FIELD

The present invention relates to an organic electroluminescence device and a lighting device.

BACKGROUND ART

An organic electroluminescence device (hereinafter referred to as an organic EL device) includes an organic compound layer having an emitting layer provided between a pair of electrodes formed on a substrate. The organic EL device is usable in a light-emitting device and a lighting device.

A substrate of a typical organic EL device is a glass substrate. Thus, it is difficult to realize an organic EL device with flexibility. Further, the glass substrate itself is expensive, which results in an increase of the price of the organic EL device.

In order to deal with such problems, for instance, Patent Literature 1 discloses an organic electroluminescence device including a lower electrode, an organic compound layer including an emitting layer, and a back plate that are disposed on a flexible substrate. In Patent Literature 1, the flexible substrate is exemplified by a substrate including an aluminum foil base, an antireflection layer and an insulating layer, the antireflection layer and the insulating layer being disposed on the base. According to Patent Literature 1, such a flexible substrate contributes to improvement in a contrast reduction caused when the organic electroluminescence device is used in a display.

It has also been discussed to employ a metal substrate as a flexible substrate of an organic EL device used in a lighting device.

An electrode and an organic emitting layer of an organic EL device have a thin film thickness. Thus, when a surface of the metal substrate is not smooth, the organic EL device using the metal substrate as the flexible substrate is likely to suffer from a short-circuit between electrodes formed on the substrate, which results in a lowered yield rate. In view of the above, the surface of the metal substrate needs to be smooth, so that the surface of the metal substrate is smoothened by mirror-polishing or by an SOG (Spin On Glass) technique, in which a solution prepared by blending $SiO_2$ in a solvent is applied on a rotating substrate to form a smooth film on the surface of the substrate.

However, it is quite difficult to smoothen a large area of the surface of the metal substrate through mirror-polishing or the SOG technique and thus such methods are not suitable for mass production.

Regarding the smoothness of the surface of the metal substrate, Patent Literature 2 discloses that a nickel-plating layer is formed on the surface of the metal substrate by electroless plating to smoothen the surface. Patent Literature 2 discloses that an organic EL device is provided by sequentially laminating a functional layer, which includes an organic emitting layer, and a cathode layer on a surface of an electroless nickel-plating layer formed on the surface of the metal substrate.

CITATION LIST

Patent Literatures

Patent Literature 1: JP-A-2008-235193
Patent Literature 2: JP-A-2008-243772

SUMMARY OF THE INVENTION

Problems To Be Solved By The Invention

Even when such an electroless plating layer as disclosed in Patent Literature 2 is formed on the surface of the metal substrate, it is still not possible to obtain a sufficient smoothness and thus the yield rate of the organic EL device is lowered.

In the organic EL device of Patent Literature 2, the functional layer, which includes the organic emitting layer, is directly laminated on the surface of the electroless plating layer with a low electrical resistivity. Thus, light emitted from the organic emitting layer is quenched due to surface plasmon absorption, which results in lowering a light-extraction efficiency.

An object of the present invention is to provide an organic EL device with an improved yield rate and an improved light-extraction efficiency, and a lighting device using the organic EL device.

Means for Solving the Problems

According to an aspect of the invention, an organic electroluminescence device includes: a first substrate; a reflective metal layer; a first electrode; an organic compound layer; and a second electrode, which are sequentially disposed, in which the first substrate is provided by at least one of a metal film, a metal plate, a polymer film, a polymer plate, a polymer film with a damp-proof film, and a polymer plate with a damp-proof film, a smoothening layer is formed partially between the reflective metal layer and the first electrode, and the reflective metal layer and the first electrode are electrically conductive to each other at a region where the smoothening layer is not formed.

With the above arrangement, since the smoothening layer is formed partially between the reflective metal layer and the first electrode, the first electrode is in contact with the smoothening layer whose surface is smoother than a surface of the reflective metal layer. As a result, a short-circuit between the first electrode and the second electrode resulting from a surface roughness of the reflective metal layer can be prevented, thereby improving the yield rate of the organic EL device.

Since the reflective metal layer and the first electrode are electrically conductive to each other at the region where the smoothening layer is not formed, the reflective metal layer can also serve as an auxiliary electrode for the first electrode. Thus, a voltage drop at the first electrode is reduced, thereby suppressing unevenness in luminescence intensity.

Since the reflective metal layer also serves as the auxiliary electrode, the first electrode can be formed of a material whose electrical resistivity is larger than the reflective metal layer. As a result, since quenching resulting from plasmon absorption on a surface of the first electrode can be suppressed, the light-extraction efficiency can be improved.

In the above aspect, it is preferable that an intermediate layer is formed between the first electrode and the organic compound layer at a portion corresponding to the region where the smoothening layer is not formed.

When the organic compound layer is formed directly on the surface of the first electrode opposed to the second electrode at the portion corresponding to the region where the smoothening layer is not formed, the organic compound layer is affected by a surface roughness of the reflective metal layer and thus a short-circuit between the first electrode and the second electrode is likely to occur.

In the above aspect, since the intermediate layer is formed between the first electrode and the organic compound layer at the portion corresponding to the region where the smoothening layer is not formed, a short-circuit between the first electrode and the second electrode can be prevented.

In the above aspect, it is preferable that the intermediate layer is formed of an electrically insulating material.

With the above arrangement, since the intermediate layer is formed of the electrically insulating material, a short-circuit between the first electrode and the second electrode can be prevented with a higher reliability.

In the above aspect, it is preferable that the reflective metal layer is one of a layer including a binder and at least one of silver, gold, tungsten, aluminum and nickel, and a metal-plating layer.

With the above arrangement, since the reflective metal layer is one of the layer including a binder and at least one of silver, gold, tungsten, aluminum and nickel, and the metal-plating layer, the reflective metal layer, which also serves as the auxiliary electrode, can have a lowered electrically resistivity.

In the above aspect, it is preferable that the first electrode is an electrically conductive member including an electrically conductive polymer.

With the above arrangement, since the first electrode is the electrically conductive member including the electrically conductive polymer, the first electrode can have electrical conductivity, transparency and stability.

In the above aspect, it is preferable that each of the first electrode and the second electrode is a transparent electrode.

With the above arrangement, since each of the first electrode and the second electrode is the transparent electrode, the electrical resistivity is increased as compared with a metal electrode and thus quenching resulting from plasmon absorption on the surface of each of the first electrode and the second electrode can be suppressed. As a result, a light-extraction efficiency can be improved.

In the above aspect, it is preferable that the organic EL device further includes: a first electrode drawing portion being formed at a periphery of the first substrate to be electrically conductive to the first electrode for electrical extraction; a second electrode drawing portion being formed at the periphery of the first substrate to be electrically conductive to the second electrode for electrical extraction; a sealing member being disposed to face the first substrate with the reflective metal layer, the first electrode, the organic compound layer and the second electrode being interposed therebetween; a first bonding portion at which the first substrate and the sealing member are bonded to each other, the first bonding portion being disposed at an inner side of an outer profile of the first substrate relative to the first electrode drawing portion; and a second bonding portion at which the first substrate and the sealing member are bonded to each other, the second bonding portion being disposed at an inner side of the outer profile of the first substrate relative to the second electrode drawing portion.

With the above arrangement, the first electrode drawing portion and the second electrode drawing portion are formed at the periphery of the first substrate and the organic EL device can be connected to an external power source at these portions. The sealing member is bonded to the first substrate at the first bonding portion and the second bonding portion formed at the inner side of the outer profile of the first substrate relative to the first electrode drawing portion and the second electrode drawing portion. When the organic compound layer is formed at the inner side of the outer profile of the first substrate relative to the first bonding portion and the second bonding portion, sealing reliability can be maintained by bonding the sealing member and the first substrate.

As described above, with the above arrangement, it is possible to reliably connect the organic EL device to an external power source while maintaining the sealing reliability of the organic EL device.

According to another aspect of the invention, a lighting device includes one of the above organic EL devices.

With the above arrangement, since the lighting device includes any one of the above organic EL devices, the lighting device can have improved yield rate and light-extraction efficiency as well as suppressed unevenness in luminescence intensity. Even when the lighting device has a large area, the light-extraction efficiency can be enhanced and unevenness in luminescence intensity can be suppressed.

DESCRIPTION OF EMBODIMENT

First Exemplary Embodiment

Exemplary embodiment(s) of the invention will be described below with reference to the attached drawings.

Arrangement of Organic EL Device

Figure 1:
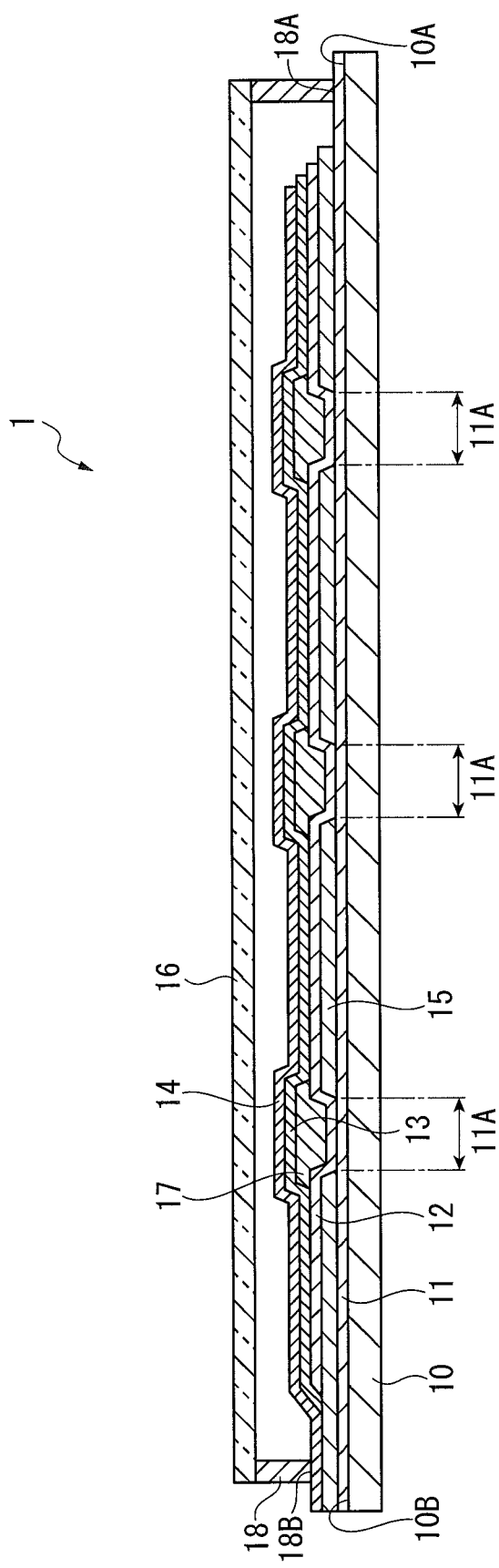
FIG. 1 is a sectional view of an organic EL device according to a first exemplary embodiment.

FIG. 1 is a sectional view of an organic EL device 1 according to a first exemplary embodiment of the invention taken along a substrate thickness direction of the organic EL device.

The organic EL device 1 includes a first substrate 10, a reflective metal layer 11, a first electrode 12, an organic compound layer 13, a second electrode 14 and a sealing member 16, which are disposed in this sequence.

A smoothening layer 15 is formed partially between the reflective metal layer 11 and the first electrode 12. Further, an intermediate layer 17 is formed between the first electrode 12 and the organic compound layer 13 at a portion corresponding to a region where the smoothening layer 15 is not formed.

In the description on the first exemplary embodiment, a "top-bottom direction" and a "right-left direction" are defined when the first substrate 10 is at the bottom and the sealing member 16 is at the top as shown in the sectional view of FIG. 1.

First Substrate

The first substrate 10 is a smooth plate member for supporting the reflective metal layer 11, the first electrode 12 and the like. The first substrate 10 is exemplified by a metal substrate, a polymer substrate or the like.

Typically, a polished glass or a glass with a high surface accuracy is employed as the first substrate. Typical substitutions of such a glass first substrate include a metal film, a metal plate, a polymer film and a polymer plate. However, the metal film and the metal plate are not suitable for use because of an insufficient surface accuracy thereof. Even when the polymer film or the polymer plate is used, it is difficult to provide a substrate having a high surface accuracy over a large area while keeping a high yield rate.

According to the exemplary embodiment, when a material and a thickness of the metal substrate or the polymer substrate are determined in line with the following conditions, a lightweight first substrate with flexibility and impact resistance can be obtained and such a first substrate can have a high surface accuracy with the assistance of the smoothening layer formed thereon.

The metal substrate of the exemplary embodiment is provided by a metal plate, a metal film thinner than the metal plate, or the like.

Specifically, aluminum (Al), copper (Cu), a stainless steel, a soft steel and the like are usable as a material of the metal substrate.

When the metal substrate is used as the first substrate 10, the first substrate 10 is excellent in heat release performance as compared with when a glass plate or the like is used. Thus, heat generated in the organic compound layer 13 can be efficiently released to an outer surface of the device.

The polymer substrate of the exemplary embodiment is provided by a polymer plate (a polymer formed in a plate shape), a polymer sheet, a polymer film, or the like, the polymer sheet and the polymer film being thinner than the polymer plate.

For forming the polymer substrate, materials such as polycarbonate resins, acrylic resins, polyethylene terephthalate resins, polyether sulfide resins and polysulfone resins are usable.

When the organic EL device 1 is required to have a flexibility in use, it is preferable that a flexible material is selected as the material of the metal substrate or the polymer substrate and that the thickness of the substrate is appropriately determined.

Regarding a dimension of the first substrate 10, when a plurality of organic EL devices 1 are adjacently disposed to be used as a light source of a lighting device, a substrate having, for instance, a longitudinal length of 30 mm to 100 mm and a lateral length of 30 mm to 100 mm is usable. A plurality of first substrates 10 may be cut out of a large-sized substrate material.

A thickness of the first substrate 10 is, for instance, in a range from 2 µm to 2 mm.

The metal material, which is superior in barrier properties against moisture and oxygen to the polymer plate, contributes to reducing a required thickness of the first substrate 1 to ensure barrier properties.

A preferred thickness of the polymer plate or film is in a range from 2 µm to 500 µm. An excessively thinned polymer plate or film is unsuitable, for instance, because a resulting substrate is difficult to handle during a manufacturing process due to the low free-standing properties thereof and because the water vapor permeability of the resulting substrate becomes large and thus a resulting device can be easily deteriorated. An excessively thickened polymer plate or film is also unsuitable because a resulting substrate is heavy.

When the first substrate 10 is provided by the polymer plate or film, it is preferable that a damp-proof film is formed on the polymer plate or polymer film to achieve a low water vapor permeability, i.e., $10^{-3}$ g/m²/day or less. It is more preferable that the reflective metal layer 11 according to the exemplary embodiment is further formed on the first substrate 10 formed of the polymer plate or film to achieve a water vapor permeability less than $10^{-5}$ g/m²/day.

A preferred thickness of the damp-proof film is in a range from 0.1 µm to 2 µm. An excessively thinned damp-proof film has poor damp-proof properties. On the other hand, an excessively thickened damp-proof film takes a long time to manufacture and is likely to be cracked by stress.

Preferred examples of a material for the damp-proof film include oxides, nitrides, oxynitrides and carbides. Particularly preferred examples of the material include SiNx (silicon nitride), SiOxNy (silicon oxynitride) and SiCxNy (silicon carbonitride).

A CVD method or sputtering is preferably usable for formation of the damp-proof film.

A metal foil film is also preferably usable as the first substrate 10 because the water vapor permeability of the first substrate 10 can be lowered to less than $10^{-5}$ g/m²/day.

A preferred thickness of the metal foil film is in a range from 2 µm to 500 µm. An excessively thinned metal foil film is not suitable, for instance, because a resulting substrate is difficult to handle during the manufacturing process due to the low free-standing properties thereof. An excessively thickened metal foil film is also unsuitable because a resulting substrate is heavy.

When the first substrate 10 is thinly provided by the polymer film, the polymer film with the damp-proof film, the metal foil film, or the like and thus is difficult to handle during the manufacturing process, an additional auxiliary substrate may be attached on the first substrate 10 so that the additional auxiliary substrate and the first substrate 10 are temporarily united. In this manner, the first substrate 10 can have an increased thickness as a whole and can thus be easier to handle. The reflective metal layer, the smoothening layer, the first electrode, the organic compound layer and the second electrode may be formed on such a united first substrate 10 in this sequence and the auxiliary substrate may be removed from the first substrate 10 after a sealing process. In this manner, the thickness of the first substrate can be thinned to several µm to 100 µm thereby providing a super-shin organic EL illumination that cannot be provided using a conventional technique.

A periphery of the first substrate 10 is provided with a first electrode drawing portion 10A and a second electrode drawing portion 10B, the first electrode drawing portion 10A being used for electrical extraction from the first electrode 12, the second electrode drawing portion 10B being used for electrical extraction from the second electrode 14. In the first exemplary embodiment, as shown in FIG. 1, an end of the first substrate 10 serves as the first electrode drawing portion 10A and the other end serves as the second electrode drawing portion 10B.

Reflective Metal Layer

When light is emitted from an emitting layer of the organic compound layer 13 toward the first electrode 12, the reflective metal layer 11 reflects the light toward the second electrode 14. The reflective metal layer 11 is formed on the first substrate 10. The reflective metal layer 11 extends from the first electrode drawing portion 10A to the second electrode drawing portion 10B. The reflective metal layer 11 on the first electrode drawing portion 10A is electrically connected to an external power source. In this manner, electrode extraction from the first electrode 12 is performed.

Examples of a material for the reflective metal layer 11 include a metal and a known alloy. The metal preferably contains at least one of, for instance, silver (Ag), Al (aluminum), Au (gold), W (tungsten) and Ni (nickel). In particular, an alloy of Ag and a metal such as Pd, Au, Ni, Bi, Nd, Ir and Cu is preferably usable because the resulting reflective metal layer 11 exhibits an improved corrosion resistance and is more firmly adhered on the substrate.

The material for the reflective metal layer 11 may contain the above examples of metal and alloy and a binder. Specifically, the reflective metal layer 11 is preferably provided using an electrically conductive paste material containing the above examples of metal and alloy and the binder. A resin material or an inorganic material is usable as the binder. Examples of the resin material for the binder include an acrylic resin and PET (polyethylene terephthalate). An example of the inorganic material for the binder is a glass flit. The electrically conductive paste material may further contain an organic solvent or the like for adjusting viscosity so that the electrically conductive paste material is in a paste form. The electrically conductive paste material is preferably a silver paste. When the electrically conductive paste material is used, a thickness of the reflective metal layer 11 is preferably in a range from 0.5 μm to 20 μm. When the reflective metal layer 11 has such a thickness, the electrically conductive paste can be easily printed.

The reflective metal layer 11 is preferably a metal-plating layer. The metal-plating layer is formed by performing at least one of electroless plating and electrolytic plating on a surface of the first substrate 10. Examples of a metal forming the metal-plating layer include nickel, copper, silver, gold, zinc, platinum and an alloy. When the reflective metal layer 11 is provided by the metal-plating layer, a plating process may be performed not only on both surfaces of the first substrate 10 but also on side surfaces of the first substrate 10 or may be selectively performed on a surface on which the first electrode 12 and the like are to be formed. A thickness of the metal-plating layer is preferably in a range from 0.1 μm to 5.0 μm.

The reflective metal layer 11 is formed of a material whose electrical resistivity is smaller than the first electrode 12. Thus, when electrical conduction between the reflective metal layer 11 and the first electrode 12 is established, the reflective metal layer 11 also serves as an auxiliary electrode for the first electrode 12.

A reflectance of the reflective metal layer 11 is preferably 80% or higher, more preferably 90% or higher. A reflectance of 90% or higher can be achieved when the reflective metal layer is formed of a silver alloy or silver. Further, by reducing an influence of Plasmon quenching, it is possible to provide a large-sized organic EL illumination unit with low power consumption and high luminance The reflective metal layer 11 may have a multilayered structure. For lowering a driving voltage of the resulting EL device, an electrically conductive oxide or a semiconductor oxide is preferably laminated on the silver or silver-alloy layer, the electrically conductive oxide or the semiconductor oxide having a work function of 5.0 eV or higher, preferably a work function of 5.5 eV or higher. A preferred example of the electrically conductive oxide or the semiconductor oxide is an oxide containing at least one of In, Sn and Zn, which are metal components enabling suppression of light absorption. Particularly preferred examples include ITO (Indium Tin Oxide), IZO (Indium Zinc Oxide) (registered trademark) and ITZO (Indium Tin Zinc Oxide) (registered trademark).

Smoothening Layer

The smoothening layer 15 is provided to smoothen a surface of the reflective metal layer 11. The smoothening layer 15, which is formed on the reflective metal layer 11, extends to the second electrode drawing portion 10B but not to the first electrode drawing portion 10A.

The smoothening layer 15 of the organic EL device 1 is not formed over the reflective metal layer 11 but is formed with a space being left so that electrical conduction between the reflective metal layer 11 and the first electrode 12 can be achieved. In other words, the reflective metal layer 11 has a region 11A where the smoothening layer 15 is not formed. After the formation of the smoothening layer 15 on the reflective metal layer 11, when the first substrate 10 is seen above a surface of the smoothening layer 15, the reflective metal layer 11 is exposed at the region 11A where the smoothening layer 15 is not formed.

The surface of the smoothening layer 15 is preferably as smooth as possible. A surface roughness Ra, which is an example of an index of smoothness, is preferably in a range from 0.01 nm to 2 nm (measurement value at 100 nm square). With such a surface roughness Ra, a short-circuit between the first electrode 12 and the second electrode 14 can be prevented with a higher reliability. The surface roughness Ra can be measured using an AFM (Atomic Force Microscope). The metal plating by itself is not sufficient to achieve the above specified surface roughness Ra and thus polishing or the like is typically required after nickel plating.

A thickness of the smoothening layer 15, which is determined depending on a smoothness of the reflective metal layer 11, is preferably in a range from 0.1 μm to 3 μm for preventing a short-circuit between the first electrode 12 and the second electrode 14 with a higher reliability.

A material for the smoothening layer 15 is preferably a resin material. The resin material is preferably a polymer such as acrylic and polyimide, more preferably a photosensitive polymer. When a photosensitive organic compound is used to form the smoothening layer 15, the smoothening layer 15 is easily formed on the reflective metal layer 11 at a predetermined region by photo-etching.

A semiconductor material is also preferable as the material for the smoothening layer 15. Specifically, an electrically conductive polymer or an oxide semiconductor having an electric charge density of $1 \times 10^{-12}$ cm$^{-3}$ to $1 \times 10^{-19}$ cm$^{-3}$ is preferable.

The electrically conductive polymer is exemplified by polyaniline or polythiophene, which is commercially available and preferable as the material. A polymer with dispersed electrically conductive particulates is also preferable as the material.

The material for the smoothening layer 15 preferably have a surface resistance value of 200 Ω per square to 100 k Ω per square and a specific resistance value of $1 \times 10^4$ Ω·cm to $1 \times 10^4$ Ω·cm. Since the reflective metal layer 11 has a high electrical conductivity, even a highly resistive material as exemplified above can be usable for the smoothening layer 15, so that a defect (a short-circuit) caused when the surface is not smoothened can be outstandingly suppressed.

Since the reflective metal layer 11 is designed to reflect light, the smoothening layer 15 is preferably formed of a transparent material. The smoothening layer 15 preferably transmits 85% or more of light in a visible region (wavelength 430 nm to 650 nm).

First Electrode

The first electrode 12 serves as an anode of the organic EL device 1 for injecting holes into the organic compound layer 13. It is effective that the anode has a work function of 4.5 eV or more.

The first electrode 12 is formed on the smoothening layer 15. As described above, since the smoothening layer 15 is formed on the reflective metal layer 11 with a space being left, a part of the reflective metal layer 11 is not covered by the smoothening layer 15 and thus is exposed. The first electrode 12 is also formed on the exposed part of the reflective metal layer 11, so that the first electrode 12 is electrically conductive to the reflective metal layer 11.

Specific examples of a material for the first electrode 12 are alloys of indium-tin oxide (ITO), tin oxide (NWSA), indium-zinc oxide (IZO), gold, silver, platinum and copper.

A preferred specific example of the material for the first electrode 12 is an electrically conductive member containing an electrically conductive polymer. Examples of the electrically conductive polymer are PEDOT (polyethylenedioxythiophene), polythiophene and polyaniline. When the member containing such an electrically conductive polymer is used for the first electrode 12, the first electrode 12 can have electrical conductivity, transparency and stability.

In the organic EL device 1, the first electrode 12 is provided by a transparent electrode. The first electrode 12 preferably transmits 10% or more of light in a visible region.

The transparent electrode preferably includes a light-transmissive metal film or a film containing an electrically conductive oxide or an electrically conductive polymer.

An electrical resistivity of the light-transmissive metal film is preferably in a range from $1 \times 10^{-6}$ $\Omega \cdot cm$ to $1 \times 10^{-4}$ $\Omega \cdot cm$.

An electrical resistivity of the electrically conductive oxide is preferably in a range from $7 \times 10^{-4}$ $\Omega \cdot cm$ to $1 \times 10^{3}$ $\Omega \cdot cm$.

An electrical resistivity of the electrically conductive polymer is preferably in a range from $1 \times 10^{-4}$ $\Omega \cdot cm$ to $1 \times 10^{3}$ $\Omega \cdot cm$.

The first electrode 12 of the exemplary embodiment can be provided by the transparent electrode formed of a material whose electrical resistivity is lager than a metal electrode or the like, so that quenching resulting from plasmon absorption can be suppressed for improving the light-extraction efficiency. The first electrode 12 of the exemplary embodiment may be a semimetal or a semiconductor and thus the electric charge density can be in a range from $1 \times 10^{-12}$ $cm^{-3}$ to $1 \times 10^{-19}$ $cm^{-3}$. Thus, quenching resulting from plasmon absorption can be particularly suppressed. As the semiconductor, in addition to the above described electrically conductive oxide or electrically conductive polymer, carbon, nanophen, an organic hole transporting material p-doped with an acceptor (p-doped organic layer) and an organic electron transporting layer n-doped with a donor (n-doped organic layer) are also preferably usable. Alternatively, a combination selected from among a thin film metal, a semimetal, a semiconductor and an organic semiconductor (e.g., electrically conductive polymer, p-doped organic layer or n-doped organic layer) may be laminated to provide the first electrode 12.

A thickness of the first electrode 12, which depends on a used material and a required sheet resistivity of the first electrode 12, is usually in a range from 10 nm to 1 µm, preferably in a range from 10 nm to 200 nm Intermediate Layer The intermediate layer 17 is formed on the first electrode 12 at a portion corresponding to the region 11A where the smoothening layer 15 is not formed. In other words, the intermediate layer 17 is formed at the region where the reflective metal layer 11 is electrically conductive to the first electrode 12.

When the first electrode 12 is formed directly on the region 11A where the smoothening layer 15 is not fanned without forming the intermediate layer 17, the first electrode 12 is formed on the surface of the reflective metal layer 11 with a poor smoothness. As a result, the thin organic compound layer 13, which is formed on the first electrode 12, is also affected by the poor smoothness and thus a short-circuit is likely to occur between the first electrode 12 and the second electrode 14.

In view of the above, the intermediate layer 17 is formed for preventing a short-circuit at the region 11A where the smoothening layer 15 is not formed.

As long as a short-circuit can be prevented between the first electrode 12 and the second electrode 14, a thickness of the intermediate layer 17 is preferably determined depending on a material for the intermediate layer 17. Specifically, the intermediate layer 17 preferably has a thickness sufficient to eliminate a step on the surface of the first electrode 12 between the region where the smoothening layer 15 is formed and the region 11A where the smoothening layer 15 is not formed. When the surface of the first electrode 12 has such a step, the organic compound layer 13 in the form of a thin film is easily broken at a corner of the step, so that a short-circuit is likely to occur between the first electrode 12 and the second electrode 14. It is particularly preferable that the thickness of the intermediate layer 17 is determined such that a surface of the intermediate layer 17 is substantially flush with the surface of the first electrode 12. As a result, a surface of the organic compound layer 13 can be smoothened.

The intermediate layer 17 is preferably formed of a material having electrical insulation properties (an electrically insulating material). With such an arrangement, a short-circuit between the first electrode 12 and the second electrode 14 can be prevented with a higher reliability. Examples of the electrically insulating material include photosensitive resins such as a photosensitive polyimide, light-curable resins such as an acrylic resin, thermosetting resins, and inorganic materials such as silicon oxide ($SiO_2$) and aluminum oxide ($Al_2O_3$). The photosensitive resins may include positive photosensitive resins and negative photosensitive resins.

The intermediate layer 17 may be formed of a material different from that of the first electrode 12 or, alternatively, may be formed by treating the surface of the first electrode 12 to transmute the electrically conductive material of the first electrode 12 into an insulating material (e.g., a metal oxide film).

The material for the smoothening layer 15 is also usable for the intermediate layer 17. Electrically conductive polymer materials such as the above electrically conductive polymer and polymer with dispersed electrically conductive particulates are also usable. When the material for the smoothening layer 15 is used for the intermediate layer 17, it is requisite that the luminous efficiency and current density of the device at the portion corresponding to the region 11A where the smoothening layer 15 is not formed is substantially equivalent to those at the portion corresponding to the region where the smoothening layer 15 is formed. An explanation will be made below on the reason why the material for the smoothening layer 15 is usable for the intermediate layer 17 under the above condition.

When an electrically insulating material is used, no electric charge is injected from the electrically insulating material into an organic layer, so that no light is emitted at the portion of the organic compound layer 13 corresponding to the region 11A where the smoothening layer 15 is not formed. In contrast, when the electrically conductive polymer material is used, electric charges are injected from the first electrode 12 via the intermediate layer 17 containing the electrically conductive polymer material into not only the portion of the organic compound layer 13 corresponding to the formation region of the smoothening layer 15 but also the portion of the organic compound layer 13 corresponding to the region 11A where the smoothening layer 15 is not formed.

However, when a current density on the surface of the intermediate layer 17 is large, since the device preferentially emits light at a portion corresponding to the formation region of the intermediate layer 17, the portion is severely deteriorated. In view of the above, a current density at the portion corresponding to the region 11A where the smoothening layer 15 is not formed is substantially the same as or lower than a current density at the portion corresponding to the formation region of the smoothening layer 15. It is particularly preferable that when the intermediate layer 17 containing the electrically conductive polymer material is formed at the portion corresponding to the region 11A where the smoothening layer 15 is not formed, the luminous efficiency and current density of the device, including this portion, are substantially uniform as described above. In this manner, the device can emit light even at a connected portion between the first electrode 12 and the reflective metal layer 11, i.e., at the portion corresponding to the region 11A where the smoothening layer 15 is not formed, resulting in an increase in a light-emitting area.

Organic Compound Layer

The organic compound layer 13 includes at least one layer of an organic compound. The organic compound layer 13 may contain an inorganic compound.

The organic compound layer 13 is formed on the first electrode 12 and the intermediate layer 17 to cover the first electrode 12 and the intermediate layer 17.

The organic compound layer 13 is formed at an inner side of an outer profile of the first substrate 10 relative to a first bonding portion 18A and a second bonding portion 18B (described later).

In the organic EL device 1, the organic compound layer 13 includes at least one emitting layer. Accordingly, the organic compound layer 13 may be provided, for instance, by a single emitting layer or by a multilayered structure including layers useable in a known organic EL device (e.g., a hole injecting layer, a hole transporting layer, an electron injecting layer and an electron transporting layer) and an emitting layer interposed therebetween.

The emitting layer, which is formed of a known emitting material usable in a typical organic EL device, provides a single-color emission such as red, green, blue or yellow emission or combined-color emission of red, green, blue and yellow emission (e.g., white-color emission). For forming the emitting layer, a doping method, according to which an emitting material (dopant) is doped to a host, has been known as a usable method. The emitting layer formed by the doping method can efficiently generate excitons from electric charges injected into the host. With the exciton energy generated by the excitons being transferred to the dopant, the dopant can emit light with a high efficiency.

The emitting layer may be fluorescent or phosphorescent.

A thickness of the emitting layer is preferably in a range from 5 nm to 50 nm, more preferably from 7 nm to 50 nm, the most preferably 10 nm to 50 nm. A thickness below 5 nm may cause difficulty in forming the emitting layer and in controlling chromaticity, while a thickness above 50 nm may increase a driving voltage of the device.

Materials for the hole injecting layer, the hole transporting layer, the electron injecting layer, electron transporting layer and the like can be selected from among known materials usable for a typical organic EL device.

A thickness of each layer forming the organic compound layer 13 is not particularly limited except for ones particularly specified above. However, the thickness of each layer is typically preferably in a range from several nanometers to 1 μm, approximately, because an excessively-thinned film is likely to cause defects such as a pin hole, while an excessively-thickened film inefficiently requires application of a high voltage.

Second Electrode

The second electrode 14 serves as a cathode of the organic EL device 1 for injecting electrons into the organic compound layer 13 and is preferably formed of a material having a small work function.

The second electrode 14 is formed on the organic compound layer 13.

The second electrode 14 extends to the second electrode drawing portion 10B for electrode extraction. The second electrode 14 on the second electrode drawing portion 10B is electrically connected to an external power source.

In the organic EL device 1, since light emitted from the organic compound layer 13 is extracted through the sealing member 16, the second electrode 14 is provided by a transparent electrode. The second electrode 14 preferably transmits 10% or more of light in a visible region.

The above-described transparent electrode material for the first electrode 12 is usable as a material for the second electrode 14.

A thickness of the second electrode 14 is defined the same as the thickness of the first electrode 12.

Sealing Member

The sealing member 16 is disposed to be opposed to the first substrate 10 with the reflective metal layer 11, the first electrode 12, the organic compound layer 13 and the second electrode 14 being interposed therebetween.

The sealing member 16 is bonded to the first substrate 10 at the periphery of the first substrate 10 through a bonding member 18.

The organic EL device 1 includes: the first bonding portion 18A at which the first substrate 10 and the sealing member 16 are bonded to each other; and the second bonding portion 18B at which the first substrate 10 and the sealing member 16 are bonded to each other with the second electrode 14 being interposed therebetween. As shown in FIG. 1, the first substrate 10 and the sealing member 16 are preferably bonded to each other at the first boding portion 18A with the reflective metal layer 11 being interposed therebetween.

The first bonding portion 18A is disposed at an inner side of the outer profile of the first substrate 10 relative to the first electrode drawing portion 10A, while the second bonding portion 18B is disposed at an inner side of the outer profile of the first substrate 10 relative to the second electrode drawing portion 10B.

A material for the sealing member 16 is selected from a sealing coat, a sealing plate and the sealing film. Specific examples of the material include a glass plate, a polymer plate, a glass film, a polymer film, a metal plate and a metal foil.

Particularly, the glass plate includes a soda-lime glass, a barium/strontium-containing glass, a lead glass, an aluminosilicate glass, a borosilicate glass, a barium borosilicate glass and a quartz.

For the polymer plate, materials such as a polycarbonate resin, an acrylic resin, a polyethylene terephthalate resin, a polyether sulfide resin and a polysulfone resin can be used. For the polymer film, these materials can also be used.

When the organic EL device 1 is required to have a flexibility in use, the sealing member 16 is preferably formed of a flexible material such as a polymer plate and polymer film and a glass film.

A glass plate and a glass film have excellent barrier properties against moisture and oxygen and thus are preferably usable.

In the organic EL device 1, since light emitted from the organic compound layer 13 is extracted through the sealing member 16, the sealing member 16 is preferably formed of a material that transmits 50% or more of light in a visible region.

A dimension of the sealing member 16 is not specified as long as the sealing member 16 can serve to seal the organic compound layer 13 and the like, and thus may be substantially the same as the dimension of the first substrate 10. However, as long as the sealing member 16 is connectable to the first electrode drawing portion 10A and the second electrode drawing portion 10B on the first substrate 10, the sealing member 16 is preferably formed smaller than the first substrate 10.

The bonding member 18 serves to bond the first substrate 10 and the sealing member 16. In terms of sealing reliability, moisture resistance and bond strength, the bonding member 18 is preferably formed of an inorganic compound. When the sealing member 16 is a glass plate or a glass film, the bonding member 18 is preferably a glass having a low-melting point so that the first substrate 10 and the sealing member 16 are bonded by laser irradiation. The "low-melting point" herein is a melting point equal to or lower than 650 degrees C. A preferred melting point is in a range from 300 degrees C. to 600 degrees C. Such a low-melting glass is preferably a glass whose composition contains a transition metal oxide, a rare-earth metal oxide or the like capable of bonding a glass and a metal, more preferably a granulated glass (fitted glass). A composition of the granulated glass preferably contains $SiO_2$, $B_2O_3$ and $Al_2O_3$.

Manufacturing Process of Organic EL Device

Next, a manufacturing process of the organic EL device 1 will be described with reference to the drawings.

Figure 2A:
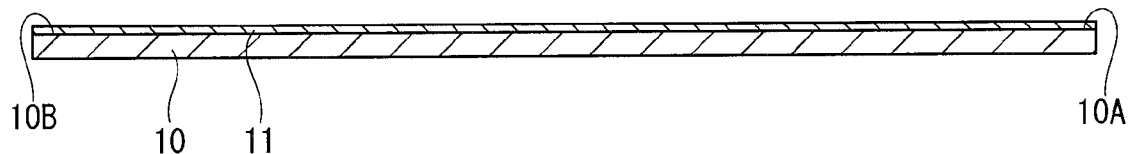
FIG. 2A is a schematic view of a manufacturing process of the organic EL device according to the first exemplary embodiment, for showing formation of a reflective metal layer on a first substrate.

First, as shown in FIG. 2A, the reflective metal layer 11 is formed on the first substrate 10. A steel plate is used as the first substrate 10. A metal-plating layer as the reflective metal layer 11 is formed on one surface of the steel plate.

Since the reflective metal layer 11 of the first exemplary embodiment is provided by the metal-plating layer, electrolytic plating is used to form the reflective metal layer 11.

When the reflective metal layer 11 is formed of the electrically conductive paste material, a printing method or a coating method may be used. Additionally, sputtering, vapor deposition and the like are also usable depending on the material for the reflective metal layer 11.

Figure 2B:
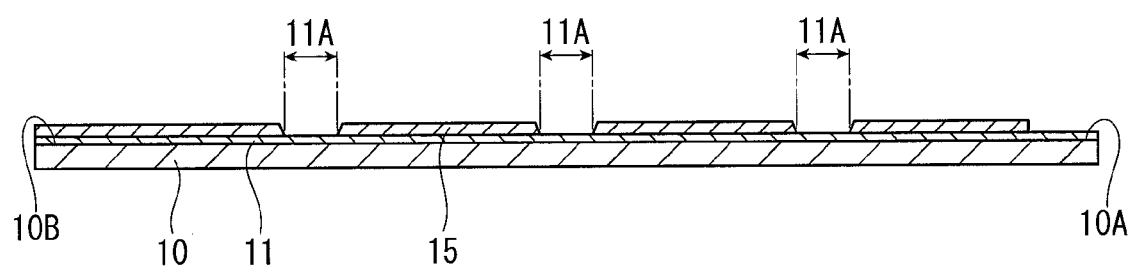
FIG. 2B is a schematic view showing formation of a smoothening layer following the formation of the reflective metal layer shown in FIG. 2A.

Subsequently, as shown in FIG. 2B, the smoothening layer 15 is formed on the reflective metal layer 11. For forming the smoothening layer 15, known wet film forming methods such as screen printing, ink-jet printing, spin coating, dipping and flow coating and known dry film forming methods such as mask evaporation and mask sputtering are usable.

In the first exemplary embodiment, after a photosensitive organic compound material is applied on the reflective metal layer 11, the smoothening layer 15 is formed by photo-etching with the space being left so that the reflective metal layer 11 and the first electrode 12 are electrically conductive at the space as described above. Simultaneously, as shown in FIG. 2B, the region 11A where the smoothening layer 15 is not formed is also formed.

Figure 2C:
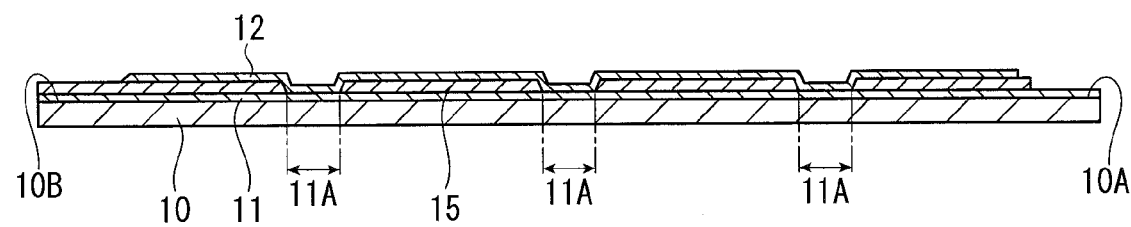
FIG. 2C is a schematic view showing formation of a first electrode following the formation of the smoothening layer shown in FIG. 2B.

Subsequently, as shown in FIG. 2C, the first electrode 12 is formed not only on the smoothening layer 15 but also on the reflective metal layer 11 exposed between parts of the smoothening layer 15 so that the first electrode 12 and the reflective metal layer 11 are electrically conductive to each other. A material for a transparent electrode is used for the first electrode 12.

For forming the first electrode 12, for instance, a film is formed by sputtering and then patterning is performed through photolithography, or mask evaporation is performed.

Figure 3A:
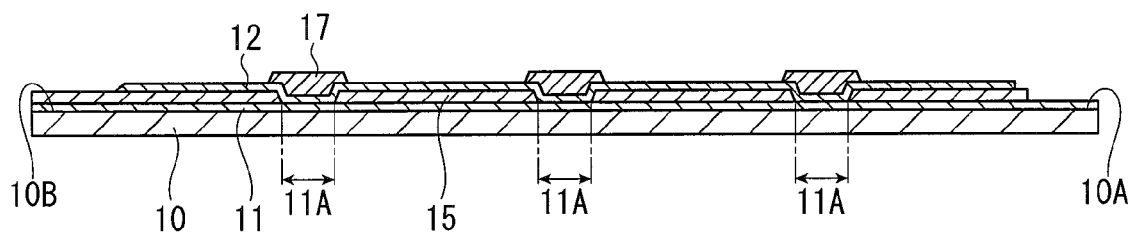
FIG. 3A is a schematic view of the manufacturing process of the organic EL device according to the first exemplary embodiment, for showing formation of an intermediate layer following the formation of the first electrode shown in FIG. 2C.

Subsequently, as shown in FIG. 3A, the intermediate layer 17 is formed at the region where the reflective metal layer 11 and the first electrode 12 are electrically conductive. For forming the intermediate layer 17, known wet film forming methods such as screen printing, ink jet printing, spin coating, dipping and flow coating and known dry film forming methods such as mask evaporation and mask sputtering are usable.

Figure 3B:
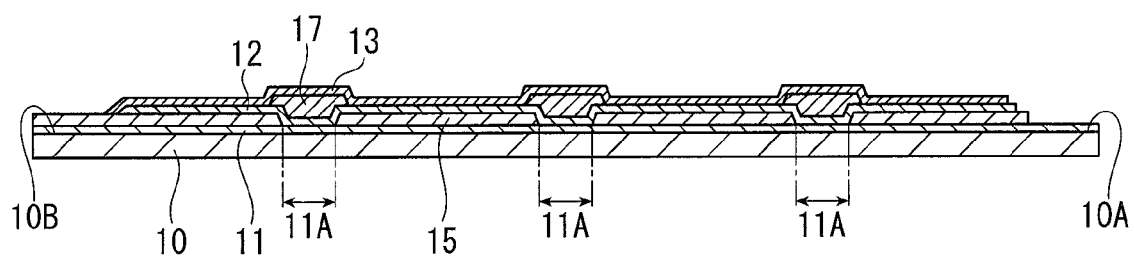
FIG. 3B is a schematic view showing formation of an organic compound layer following the formation of the intermediate layer shown in FIG. 3A.

Subsequently, as shown in FIG. 3B, the organic compound layer 13 is formed on the first electrode 12 and the intermediate layer 17.

For forming the organic compound layer 13, known methods such as dry film forming methods (e.g., vacuum deposition, sputtering, plasma method and ion plating) and wet film forming methods (e.g., spin coating, dipping, flow coating and ink-jet method) are usable.

Figure 3C:
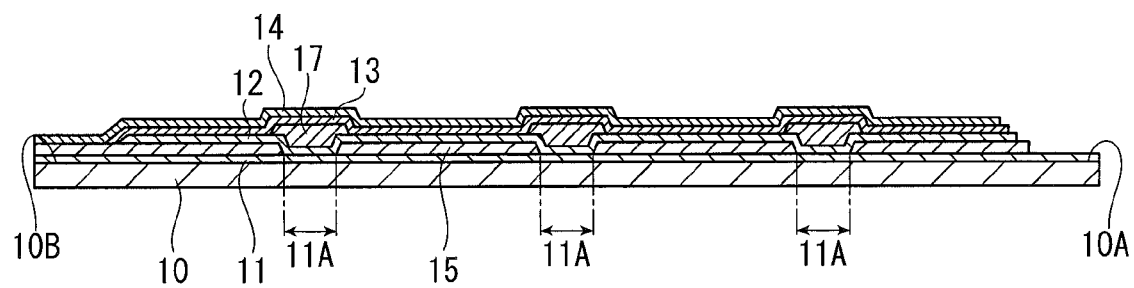
FIG. 3C is a schematic view showing formation of a second electrode following the formation of the organic compound layer shown in FIG. 3B.

Subsequently, as shown in FIG. 3C, the second electrode 14 is formed on the organic compound layer 13. A material for a transparent electrode is used for the second electrode 14.

Examples of a method to form the second electrode 14 are the same as those for the first electrode 12.

Subsequently, the sealing member 16 and the first substrate 10 are bonded through the bonding member 18 to seal the organic compound layer 13 and the like.

In this manner, the organic EL device 1 is manufactured.

Advantages and Effects of First Exemplary Embodiment

The above first exemplary embodiment provides the following advantages and effects.

(1) Since the organic EL device 1 has the smoothening layer 15 formed partially between the reflective metal layer 11 and the first electrode 12, the first electrode 12 is formed on the smoothening layer 15 whose surface is smoother than the surface of the reflective metal layer 11. As a result, a short-circuit between the first electrode 12 and the second electrode 14 resulting from a surface roughness of the reflective metal layer 11 can be prevented, thereby improving the yield rate of the organic EL device 1.

(2) In the organic EL device 1, the reflective metal layer 11 and the first electrode 12 are electrically conductive to each other at the region 11A where the smoothening layer 15 is not formed, so that the reflective metal layer 11 can also serve as the auxiliary electrode for the first electrode 12. The reflective metal layer 11, which is provided in the form of a metal-plating layer, has a lower electrical resistivity than the first electrode 12, i.e., the transparent electrode. Thus, a voltage drop at the first electrode 12 is reduced, thereby suppressing unevenness in luminescence intensity.

(3) Since the reflective metal layer 11 of the organic EL device 1 also serves as the auxiliary electrode as described above, the first electrode 12 can be formed of a material having a larger electrical resistivity than the reflective metal layer 11. Thus, the first electrode 12 is provided by the transparent electrode. As a result, since quenching resulting from plasmon absorption on the surface of the first electrode 12 can be suppressed, the light-extraction efficiency can be improved.

Further, since the second electrode 14 is also provided by the transparent electrode, quenching resulting from plasmon absorption on the surface of the second electrode 14 can also be suppressed, thereby improving the light-extraction efficiency.

(4) In the organic EL device 1, the intermediate layer 17 is formed between the first electrode 12 and the organic compound layer 13 at the portion corresponding to the region where the smoothening layer 15 is not formed, so that a short-circuit between the first electrode 12 and the second electrode 14 can be prevented.

(5) When a steel plate or a metal foil is used as the first substrate 10 of the organic EL device 1, the organic EL device 1 can be offered at a low price as compared with when a glass substrate is used.

(6) The organic compound layer 13 is formed at the inner side of the outer profile of the first substrate 10 relative to the first bonding portion 18A and the second bonding portion 18B, the first bonding portion 18A is formed at the inner side of the outer profile of the first substrate 10 relative to the first electrode drawing portion 10A, and the second bonding portion 18B is formed at the inner side of the outer profile of the first substrate 10 relative to the second electrode drawing portion 10B. As a result, it is possible to reliably connect the organic EL device 1 to an external power source while maintaining the sealing reliability of the organic EL device 1.

Modification(s)

It should be noted that the invention is not limited to the above exemplary embodiment but may include any modification and improvement as long as such modification and improvement are compatible with an object of the invention. For instance, the following modifications are acceptable as long as an object of the invention can be achieved.

Although the reflective metal layer 11 is separately formed on the first substrate 10 in the exemplary embodiment, it is merely exemplary. For instance, when the first substrate 10 is formed of a metal material and thus has a surface having a high reflectance, the first substrate 10 may also serve as the reflective metal layer 11.

Although the dimension of the first substrate 10 is specified in the above exemplary embodiment, the first substrate 10 may have a larger dimension.

Although the intermediate layer 17 is formed at the portion corresponding to the region where the smoothening layer 15 is not formed in the above exemplary embodiment, the intermediate layer 17 may also be formed at another region as well. For instance, the intermediate layer 17 may be interposed between the first electrode 12 and the second electrode 14 at peripheries of the first electrode 12 and the second electrode 14 in order to prevent a short-circuit with a higher reliability.

Although electrical extraction from the first electrode 12 is performed at the first electrode drawing portion 10A in the above exemplary embodiment, it is merely exemplary. For instance, when the first substrate 10 is formed of a material having a small electrical resistivity, the electrical extraction may be performed on the opposite surface of the first substrate 10 to the surface where the reflective metal layer 11 is formed.

Although the smoothening layer 15 is formed by photo-etching in the above exemplary embodiment, it is merely exemplary. For instance, after the smoothening layer 15 is tentatively formed over the entire reflective metal layer 11, the smoothening layer 15 may be laser-irradiated at a desired position using a laser beam machine to remove an unnecessary portion of the smoothening layer 15.

The invention claimed is:

1. An organic electroluminescence device comprising: a first substrate; a reflective metal layer; a first electrode; an organic compound layer; and a second electrode, which are sequentially disposed, wherein
    the first substrate is provided by at least one of a metal film, a metal plate, a polymer film, a polymer plate, a polymer film with a damp-proof film, and a polymer plate with a damp-proof film,
    a smoothening layer is formed partially between the reflective metal layer and the first electrode,
    the reflective metal layer and the first electrode are electrically conductive to each other at a region where the smoothening layer is not formed, and
    the organic compound layer exists between the first electrode and the second electrode in the region where the smoothening layer is not formed.

2. The organic electroluminescence device according to claim 1, wherein an intermediate layer is formed between the first electrode and the organic compound layer at a portion corresponding to the region where the smoothening layer is not formed.

3. The organic electroluminescence device according to claim 2, wherein the intermediate layer is formed of an electrically insulating material.

4. The organic electroluminescence device according to claim 1, wherein the reflective metal layer is one of a layer comprising a binder and at least one of silver, gold, tungsten, aluminum and nickel, and a metal-plating layer.

5. The organic electroluminescence device according to claim 1, wherein the first electrode is an electrically conductive member comprising an electrically conductive polymer.

6. The organic electroluminescence device according to claim 1, wherein each of the first electrode and the second electrode is a transparent electrode.

7. The organic electroluminescence device according to claim 1, further comprising:
    a first electrode drawing portion being formed at a periphery of the first substrate to be electrically conductive to the first electrode for electrical extraction;
    a second electrode drawing portion being formed at the periphery of the first substrate to be electrically conductive to the second electrode for electrical extraction;
    a sealing member being disposed to face the first substrate with the reflective metal layer, the first electrode, the organic compound layer and the second electrode being interposed therebetween;
    a first bonding portion at which the first substrate and the sealing member are bonded to each other, the first bonding portion being disposed at an inner side of an outer profile of the first substrate relative to the first electrode drawing portion; and
    a second bonding portion at which the first substrate and the sealing member are bonded to each other, the second bonding portion being disposed at an inner side of the outer profile of the first substrate relative to the second electrode drawing portion.

8. A lighting device comprising the organic electroluminescence device according claim 1.

* * * * *